(12) United States Patent
Lin et al.

(10) Patent No.: US 8,890,244 B2
(45) Date of Patent: Nov. 18, 2014

(54) LATERAL POWER MOSFET STRUCTURE AND METHOD OF MANUFACTURE

(75) Inventors: Cheng-Chi Lin, Toucheng Township, Yilan County (TW); Chen-Yuan Lin, Taitung (TW); Shih-Chin Lien, Sinihuang (TW); Shyi-Yuan Wu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 590 days.

(21) Appl. No.: 12/775,440

(22) Filed: May 6, 2010

(65) Prior Publication Data

US 2011/0140201 A1  Jun. 16, 2011

(30) Foreign Application Priority Data

Dec. 16, 2009  (TW) .................................. 098143207

(51) Int. Cl.
| | | |
|---|---|---|
| H01L 29/66 | (2006.01) | |
| H01L 29/78 | (2006.01) | |
| H01L 29/06 | (2006.01) | |
| H01L 29/08 | (2006.01) | |
| H01L 29/10 | (2006.01) | |
| H01L 29/423 | (2006.01) | |

(52) U.S. Cl.
CPC ........ *H01L 29/7816* (2013.01); *H01L 29/0634* (2013.01); *H01L 29/0696* (2013.01); *H01L 29/0878* (2013.01); *H01L 29/66689* (2013.01); *H01L 29/1087* (2013.01); *H01L 29/42368* (2013.01)
USPC .................................. 257/342; 257/E21.417

(58) Field of Classification Search
USPC .......... 257/341, 342, 343, E21.417, E29.261
See application file for complete search history.

(56) References Cited

U.S. PATENT DOCUMENTS

| | | | | |
|---|---|---|---|---|
| 5,434,435 | A * | 7/1995 | Baliga ........................... | 257/141 |
| 5,736,766 | A * | 4/1998 | Efland et al. .................. | 257/338 |
| 7,868,378 | B1 * | 1/2011 | Zuniga et al. ................. | 257/328 |
| 2006/0033156 | A1 * | 2/2006 | Huang et al. .................. | 257/335 |
| 2009/0085101 | A1 * | 4/2009 | Huang et al. .................. | 257/328 |
| 2009/0224333 | A1 * | 9/2009 | Lu et al. ........................ | 257/392 |
| 2010/0006935 | A1 * | 1/2010 | Huang et al. .................. | 257/341 |

* cited by examiner

*Primary Examiner* — Vongsavanh Sengdara
(74) *Attorney, Agent, or Firm* — Stout, Uxa & Buyan, LLP; Frank J. Uxa

(57) ABSTRACT

A lateral power MOSFET with a low specific on-resistance is described. Stacked P-top and N-grade regions in patterns of articulated circular arcs separate the source and drain of the transistor.

7 Claims, 15 Drawing Sheets

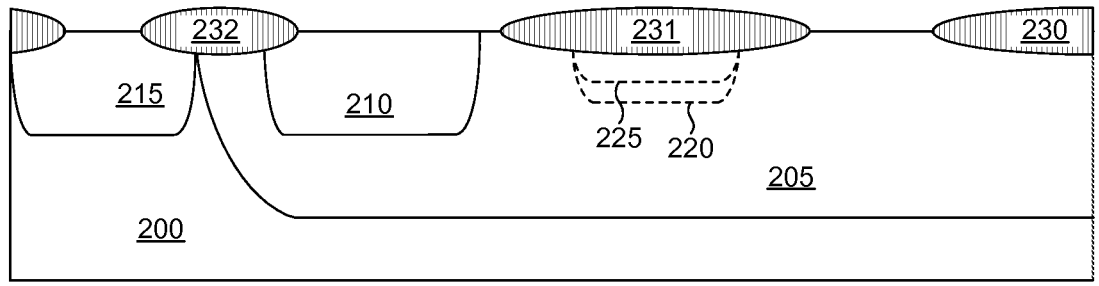
FIG. 3D1
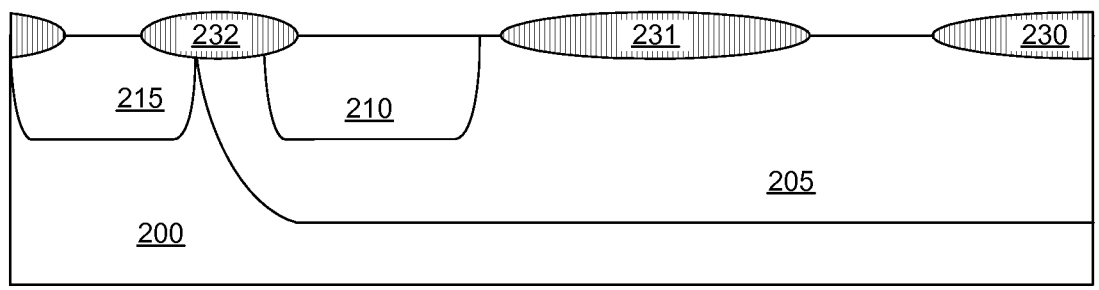
FIG. 3D2
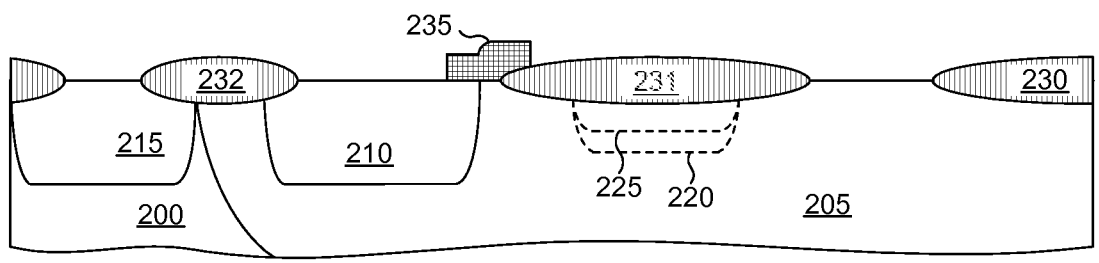
FIG. 3E1
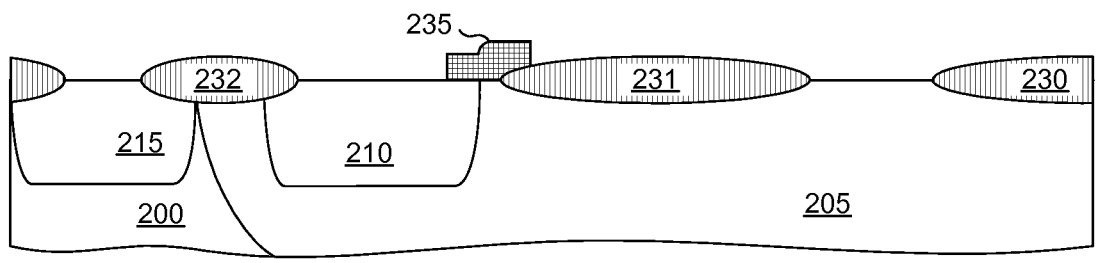
FIG. 3E2

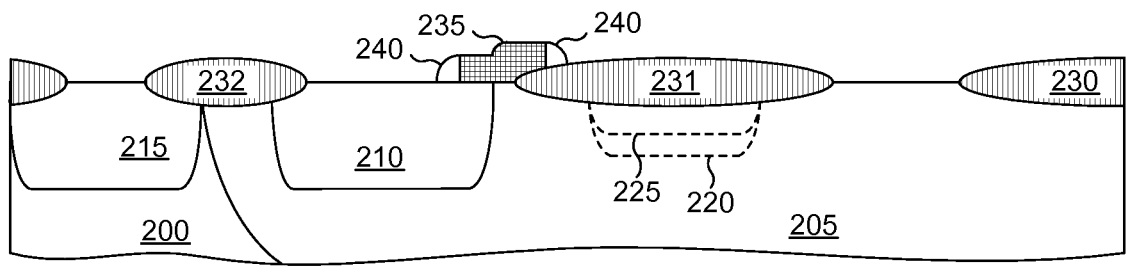
FIG. 3F1
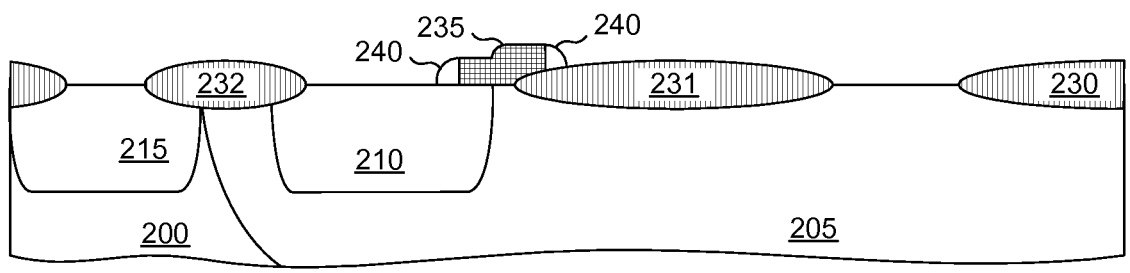
FIG. 3F2
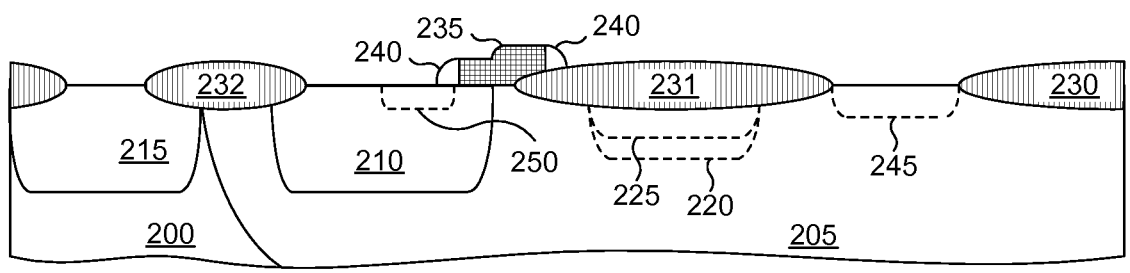
FIG. 3G1
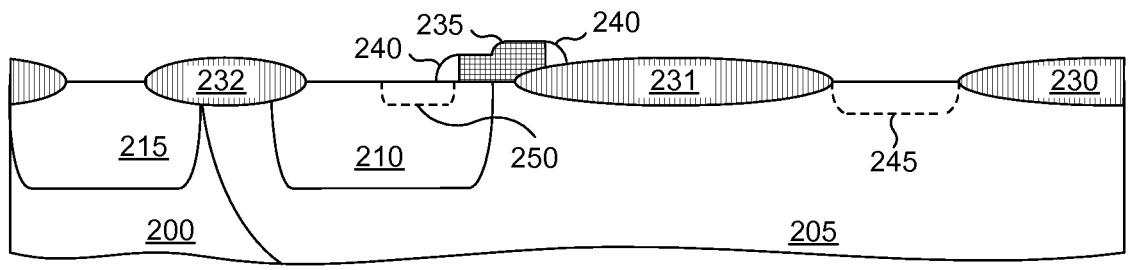
FIG. 3G2

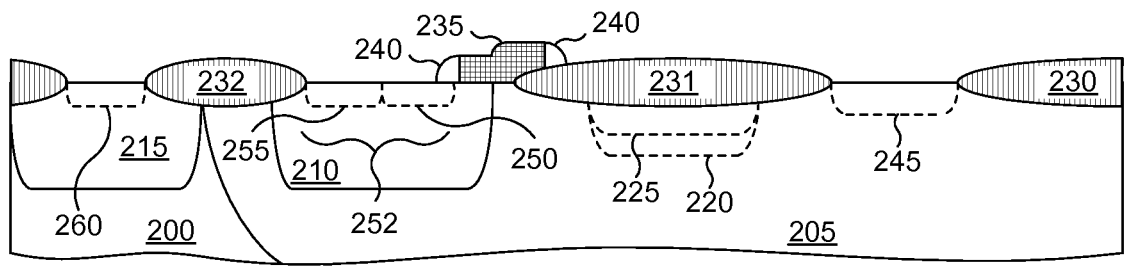
FIG. 3H1
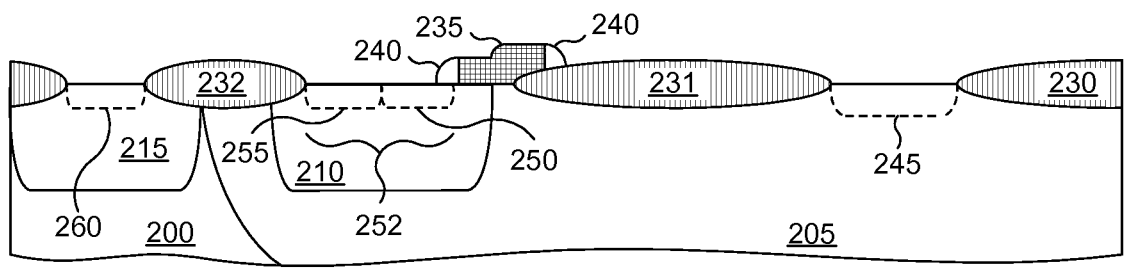
FIG. 3H2
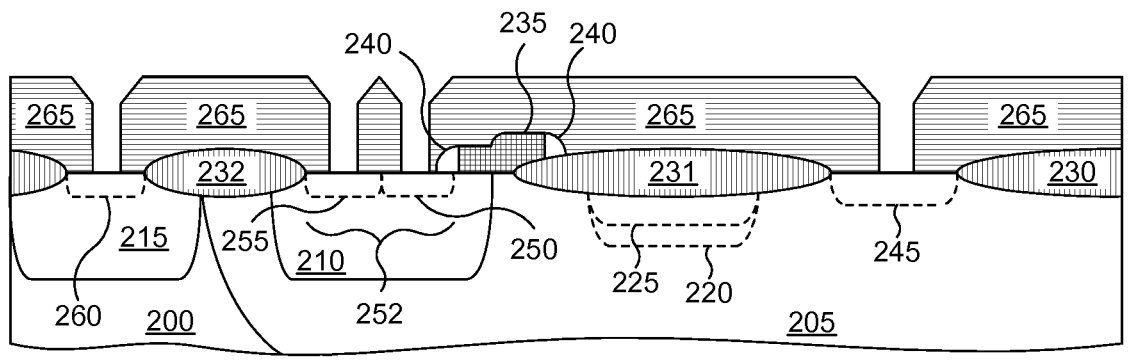
FIG. 3J1

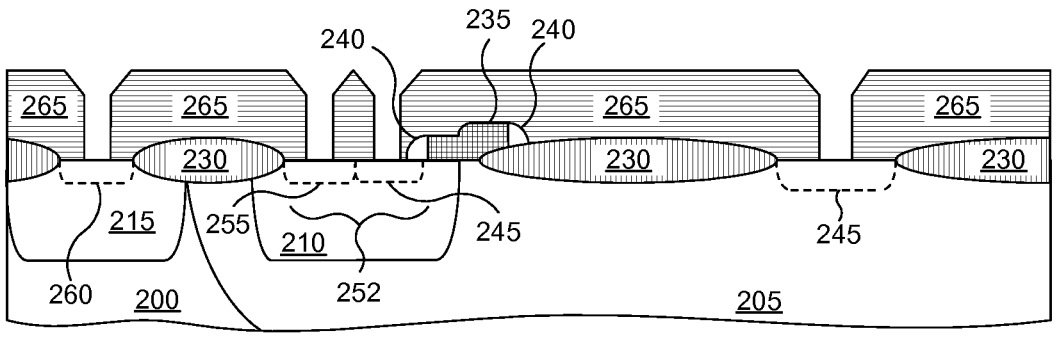
FIG. 3J2
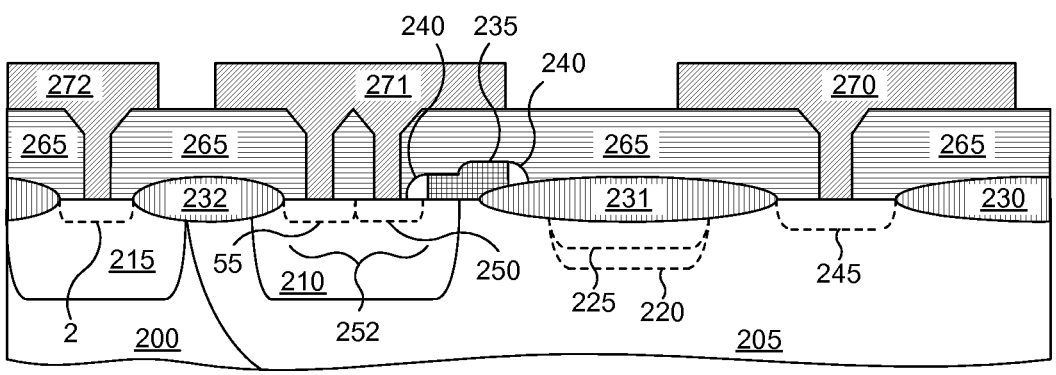
FIG. 3K1
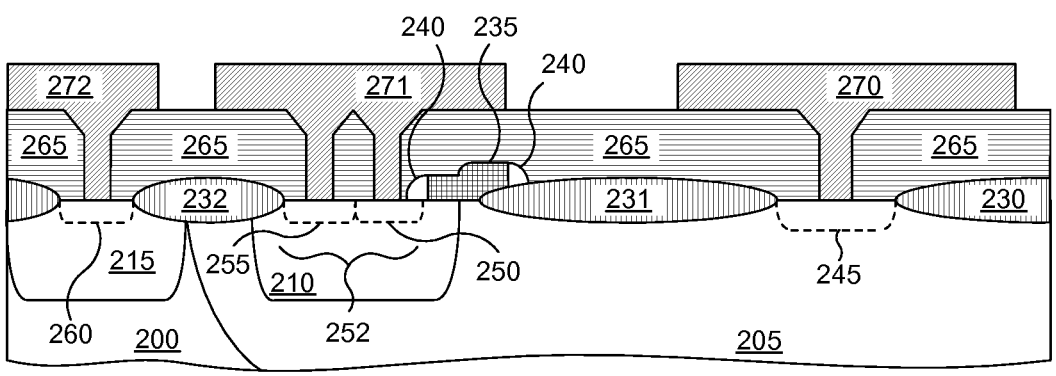
FIG. 3K2

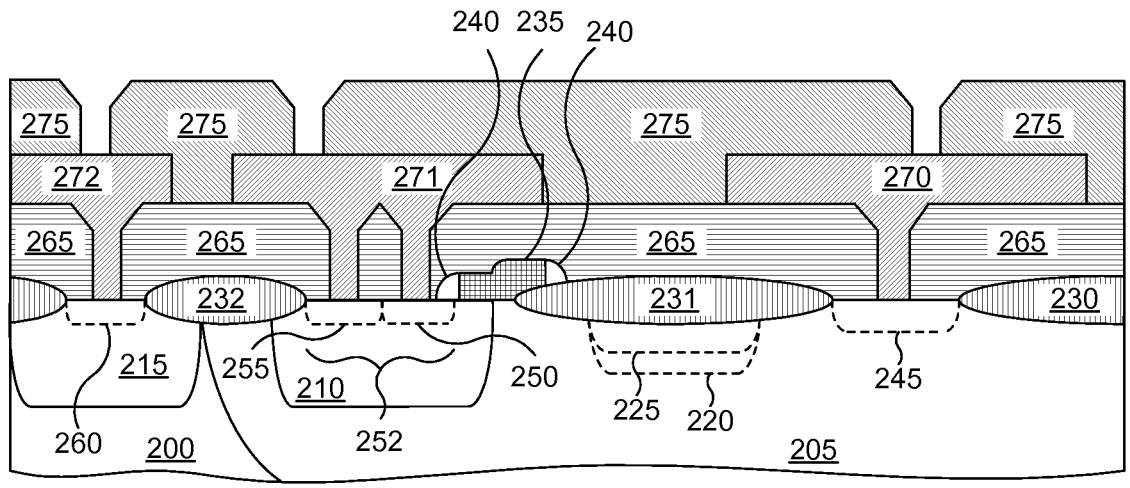
FIG. 3L1
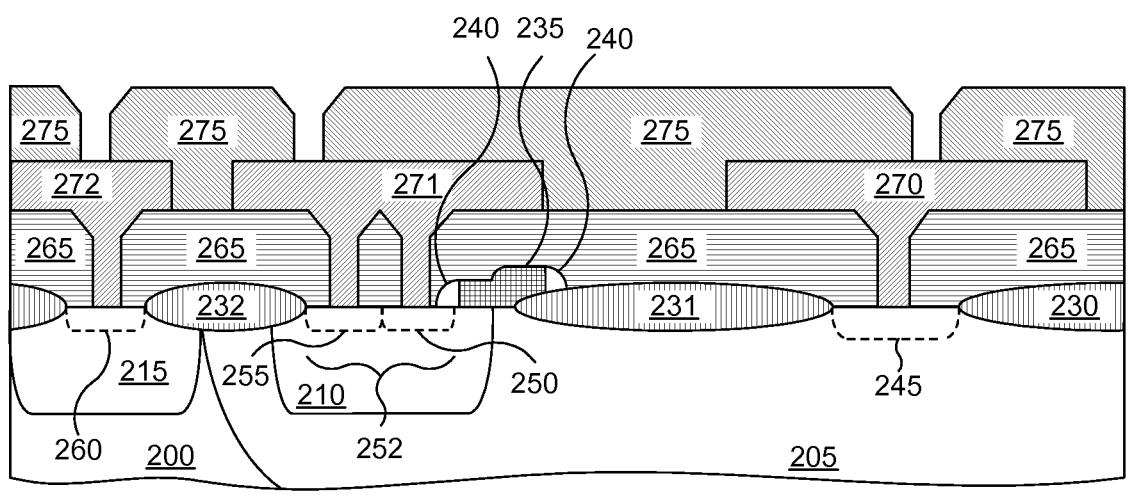
FIG. 3L2

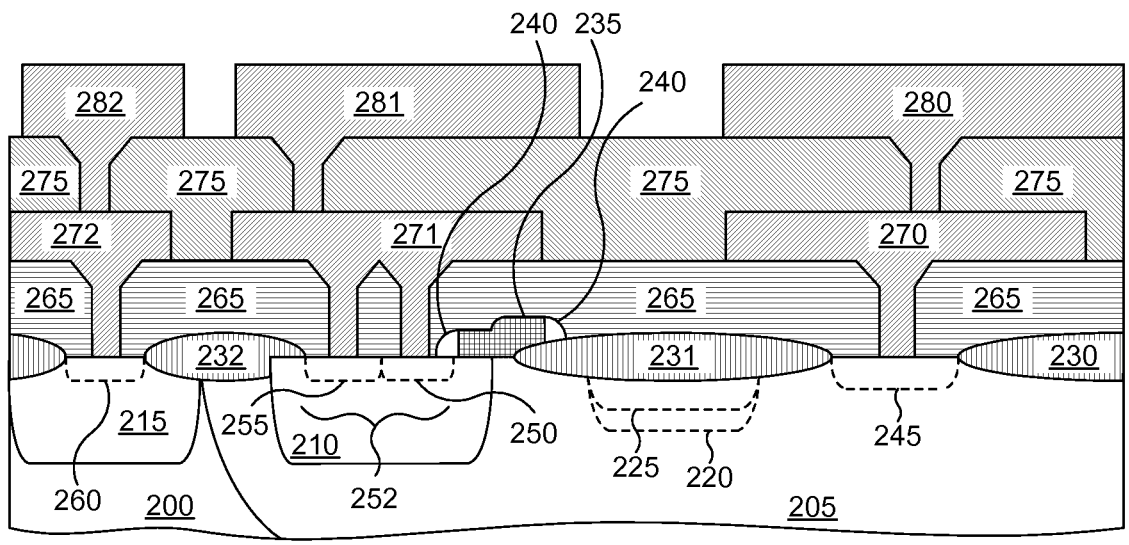
FIG. 3M1
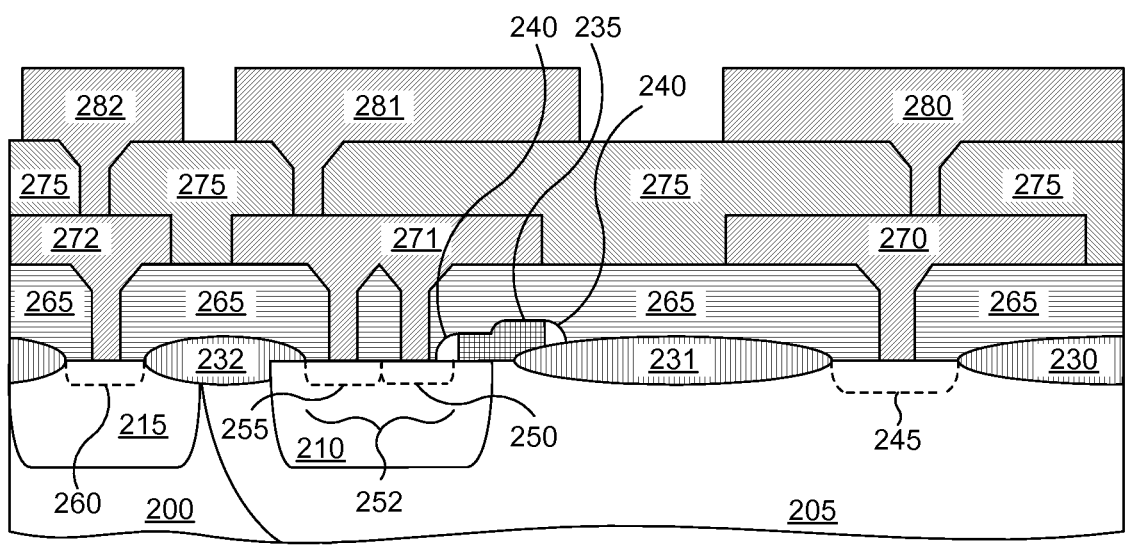
FIG. 3M2

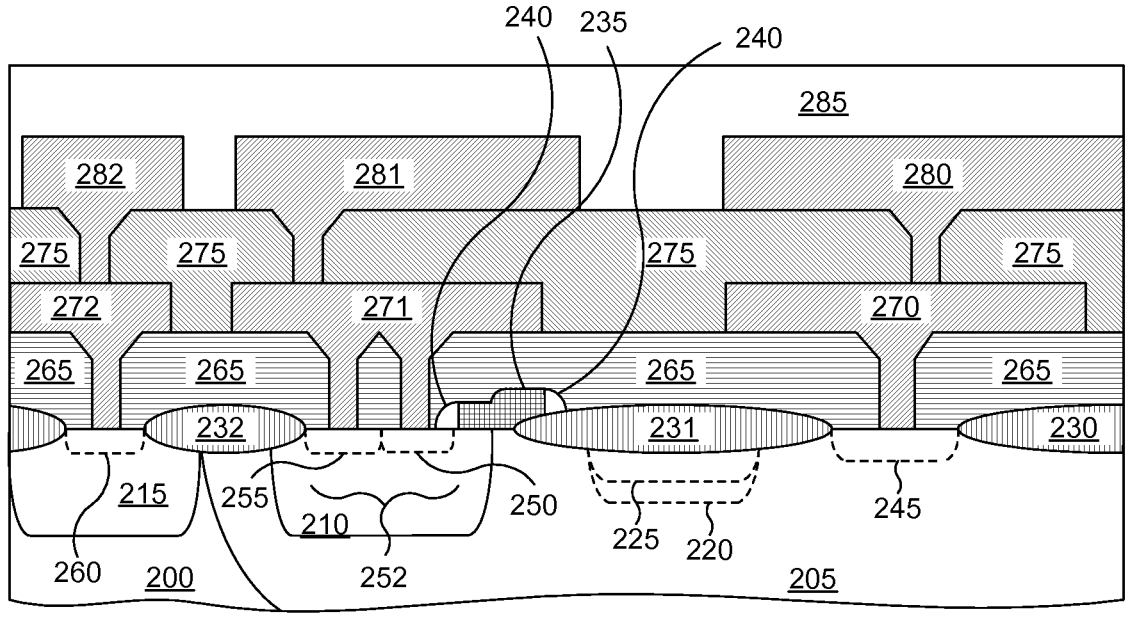
FIG. 3N1
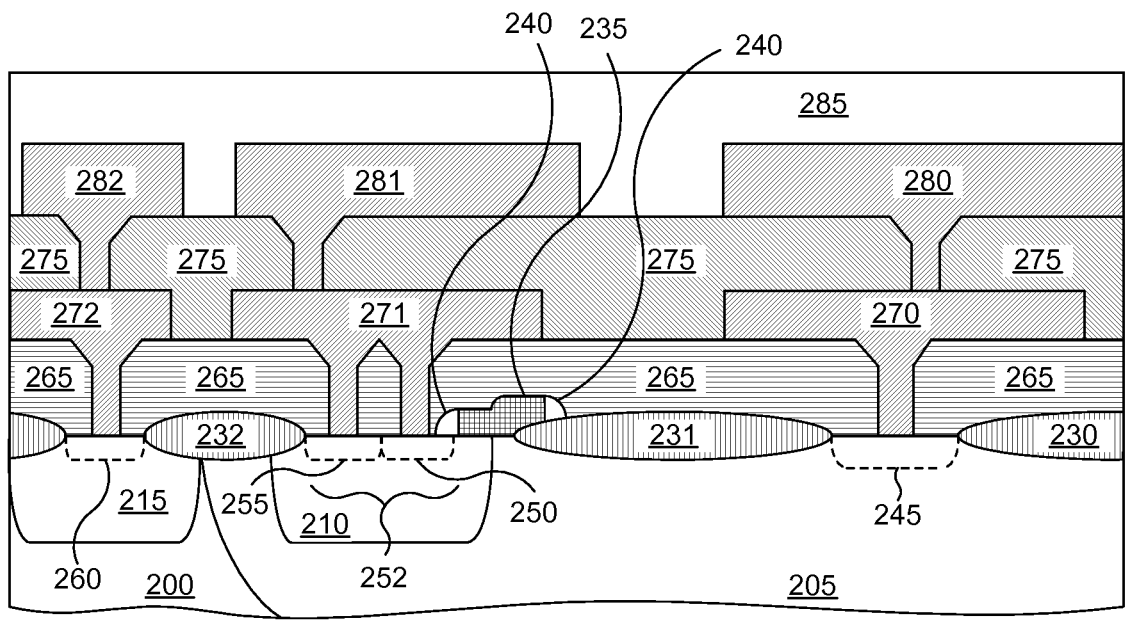
FIG. 3N2

LATERAL POWER MOSFET STRUCTURE AND METHOD OF MANUFACTURE

CROSS-REFERENCE TO RELATED APPLICATIONS

The entire contents of Taiwan Patent Application No. 098143207, filed on Dec. 16, 2009, from which this application claims priority, are incorporated herein by reference.

BACKGROUND OF THE INVENTION

1. Field of the Invention

The present invention relates generally to semiconductors and, more particularly, to power metal-oxide-semiconductor transistors and methods of fabricating and using same.

2. Description of Related Art

A lateral power metal-oxide-semiconductor field effect transistor (MOSFET) is a MOSFET fabricated with coplanar drain and source regions. Such transistors are known to support applications such as the control of electric motors. In typical applications, a power MOSFET may function as a switch controlled by gate-to-source voltage which effectively opens or closes (i.e., respectively, turns OFF or ON) a connection between the power MOSFET's drain and source.

When in an ON state, the power MOSFET should exhibit a specific on-resistance as small as possible in order to minimize power losses in the device. The on-resistance is proportional to the rate at which heat is generated by current in the device. The larger the on-resistance of the device, the less efficient the device. Accordingly, it is desired to reduce this resistance as much as possible.

The device should also have a capability to support high voltages (e.g., in excess of 700 V) without breakdown when in the OFF state. Breakdown voltage of the lateral power MOSFET should be maintained in spite of high voltage (e.g., 80% of maximum voltage or at least 560 V when maximum voltage is 700 V) applied to the drain side of the device for a long time. A conventional lateral power MOSFET exhibits a specific on-resistance of about 115 $\Omega$-mm$^2$.

A need thus exists in the prior art for a lateral power MOSFET having a specific on-resistance less than 100 $\Omega$-mm$^2$ while maintaining a breakdown voltage greater than 700 V.

SUMMARY OF THE INVENTION

According to one embodiment, the present invention addresses these needs by providing a semiconductor structure comprising a substrate formed of first-type material and having an annular high-voltage second-type well disposed therein. A first-type top region may be disposed in a first section of the second-type well, and a second-type grade region may be disposed on the first-type top region.

Another embodiment of the structure has a circular topography disposed about a center with the first section comprising a first plurality of disjoined slices defined by a first set of circular arcs, the second section comprising a second plurality of disjoined slices defined by a second set of circular arcs, and one or more slices of the first section alternating with one or more slices of the second section.

According to an embodiment of the present invention, the first type is P-type, and the second type is N-type, with the annular high-voltage second-type well being an N-well. The embodiment may comprise first and second P-wells having an annular shape and disposed in an outer portion of the N-well and in the substrate outside of and adjacent to the N-well, respectively.

An aspect of the present invention includes a method comprising providing a substrate formed of first-type material, implanting second-type atoms into an annular portion of the substrate to form a high-voltage second-type well, identifying an annular portion of a first section of a surface of the second-type well, forming a first-type top by implanting first-type atoms into the annular portion of the first section, and forming a second-type grade by implanting second-type atoms into the first-type top.

While the apparatus and method has or will be described for the sake of grammatical fluidity with functional explanations, it is to be expressly understood that the claims, unless indicated otherwise, are not to be construed as limited in any way by the construction of "means" or "steps" limitations, but are to be accorded the full scope of the meaning and equivalents of the definition provided by the claims under the judicial doctrine of equivalents.

Any feature or combination of features described or referenced herein are included within the scope of the present invention provided that the features included in any such combination are not mutually inconsistent as will be apparent from the context, this specification, and the knowledge of one skilled in the art. In addition, any feature or combination of features described or referenced may be specifically excluded from any embodiment of the present invention. For purposes of summarizing the present invention, certain aspects, advantages and novel features of the present invention are described or referenced. Of course, it is to be understood that not necessarily all such aspects, advantages or features will be embodied in any particular implementation of the present invention. Additional advantages and aspects of the present invention are apparent in the following detailed description and claims that follow.

BRIEF DESCRIPTION OF THE FIGURES

FIG. 3D1 is a cross-sectional view of the first section after forming a field oxide (FOX) layer on the structure of FIG. 3C (first section) and FIG. 3B (second section);

FIG. 3D2 is a cross-sectional view of the second section after forming the FOX layer on the structure of FIG. 3C (first section) and FIG. 3B (second section);

FIG. 3E1 is a cross-sectional view of the first section after formation of a gate on the structure of FIGS. 3D1 and 3D2;

FIG. 3E2 is a cross-sectional view of the second section after forming the gate on the structure of FIGS. 3D1 and 3D2;

FIG. 3F1 is a cross-sectional view of the first section after forming spacer structures on inner and outer faces of the gate shown in FIGS. 3E1 and 3E2;

FIG. 3F2 is a cross-sectional view of the second section after forming spacer structures on inner and outer faces of the gate shown in FIGS. 3E1 and 3E2;

FIG. 3G1 is a cross-sectional view of the first section after the N+ implantations on the structure of FIGS. 3F1 and 3F2;

FIG. 3G2 is a cross-sectional view of the second section after N+ implantations on the structure of FIGS. 3F1 and 3F2;

FIG. 3H1 is a cross-sectional view of the first section after the P+ implantations on the structure of FIGS. 3G1 and 3G2;

FIG. 3H2 is a cross-sectional view of the second section after P+ implantations on the structure of FIGS. 3G1 and 3G2;

FIG. 3J1 is a cross-sectional view of the first section after overlaying an interlayer dielectric on the structure of FIGS. 3H1 and 3H2;

FIG. 3J2 is a cross-sectional view of the second section after overlaying the interlayer dielectric on the structure of FIGS. 3H1 and 3H2;

FIG. 3K1 is a cross-sectional view of the first section after overlaying a first metal layer on the structure of FIGS. 3J1 and 3J2;

FIG. 3K2 is a cross-sectional view of the second section after overlaying the first metal layer on the structure of FIGS. 3J1 and 3J2;

FIG. 3L1 is a cross-sectional view of the first section after overlaying an intermetal dielectric layer on the structure of FIGS. 3K1 and 3K2;

FIG. 3L2 is a cross-sectional view of the second section after overlaying the intermetal dielectric layer on the structure of FIGS. 3K1 and 3K2;

FIG. 3M1 is a cross-sectional view of the first section after overlaying a second metal layer on the structure of FIGS. 3L1 and 3L2;

FIG. 3M2 is a cross-sectional view of the second section after overlaying the second metal layer on the structure of FIGS. 3L1 and 3L2;

FIG. 3N1 is a cross-sectional view of the first section after overlaying a passivation layer on the structure of FIGS. 3M1 and 3M2;

FIG. 3N2 is a cross-sectional view of the second section after overlaying the passivation layer on the structure of FIGS. 3M1 and 3M2;

DETAILED DESCRIPTION OF THE PRESENTLY PREFERRED EMBODIMENTS

Figure 1A:
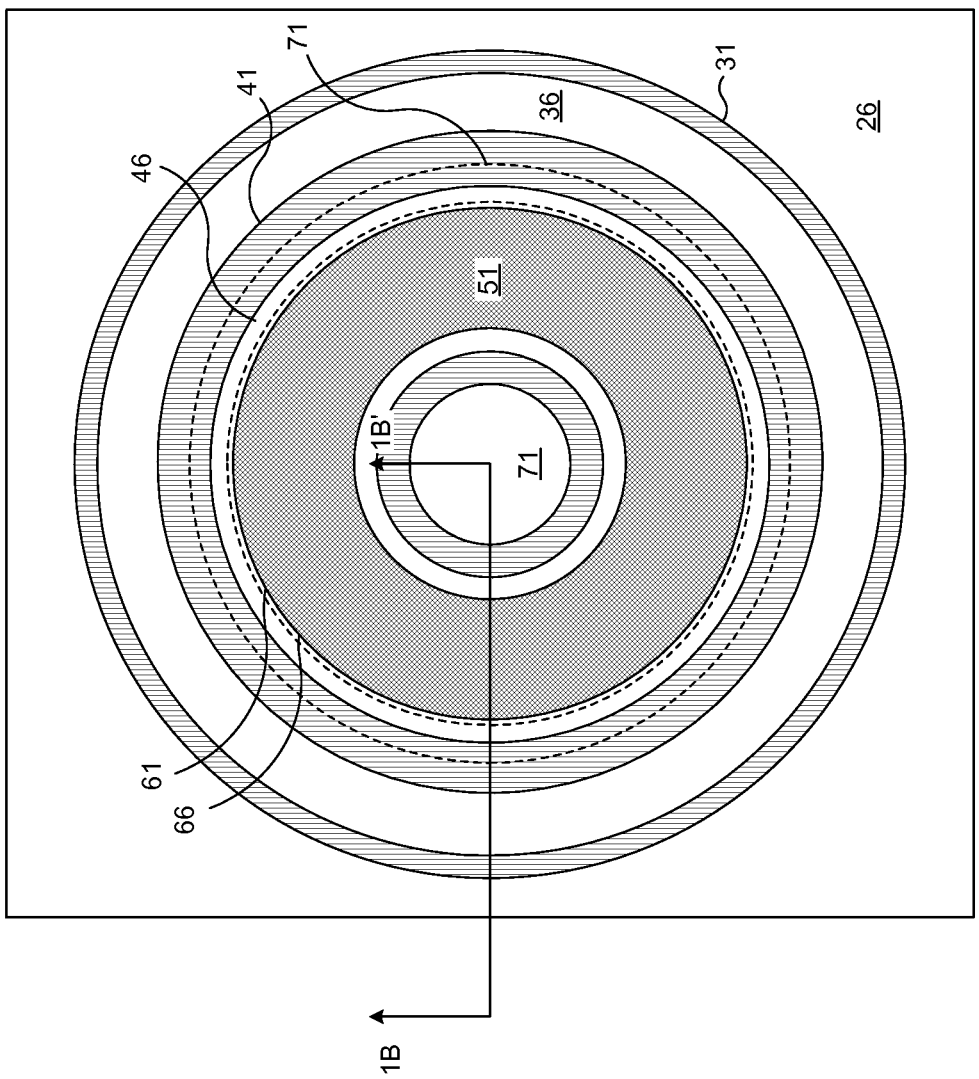
FIG. 1A shows a prior-art lateral power metal-oxide-semiconductor field effect transistor (MOSFET)

Embodiments of the invention are now described and illustrated in the accompanying drawings, instances of which are to be interpreted to be to scale in some implementations while in other implementations, for each instance, not. In certain aspects, use of like or the same reference designators in the drawings and description refers to the same, similar or analogous components and/or elements, while according to other implementations the same use should not. According to certain implementations, use of directional terms, such as, top, bottom, left, right, up, down, over, above, below, beneath, rear, and front, are to be construed literally, while in other implementations the same use should not. The present invention may be practiced in conjunction with various integrated circuit fabrication and other techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to lateral power metal-oxide-semiconductor field effect transistors (MOSFETs) and related methods of use and manufacture.

Figure 2A:
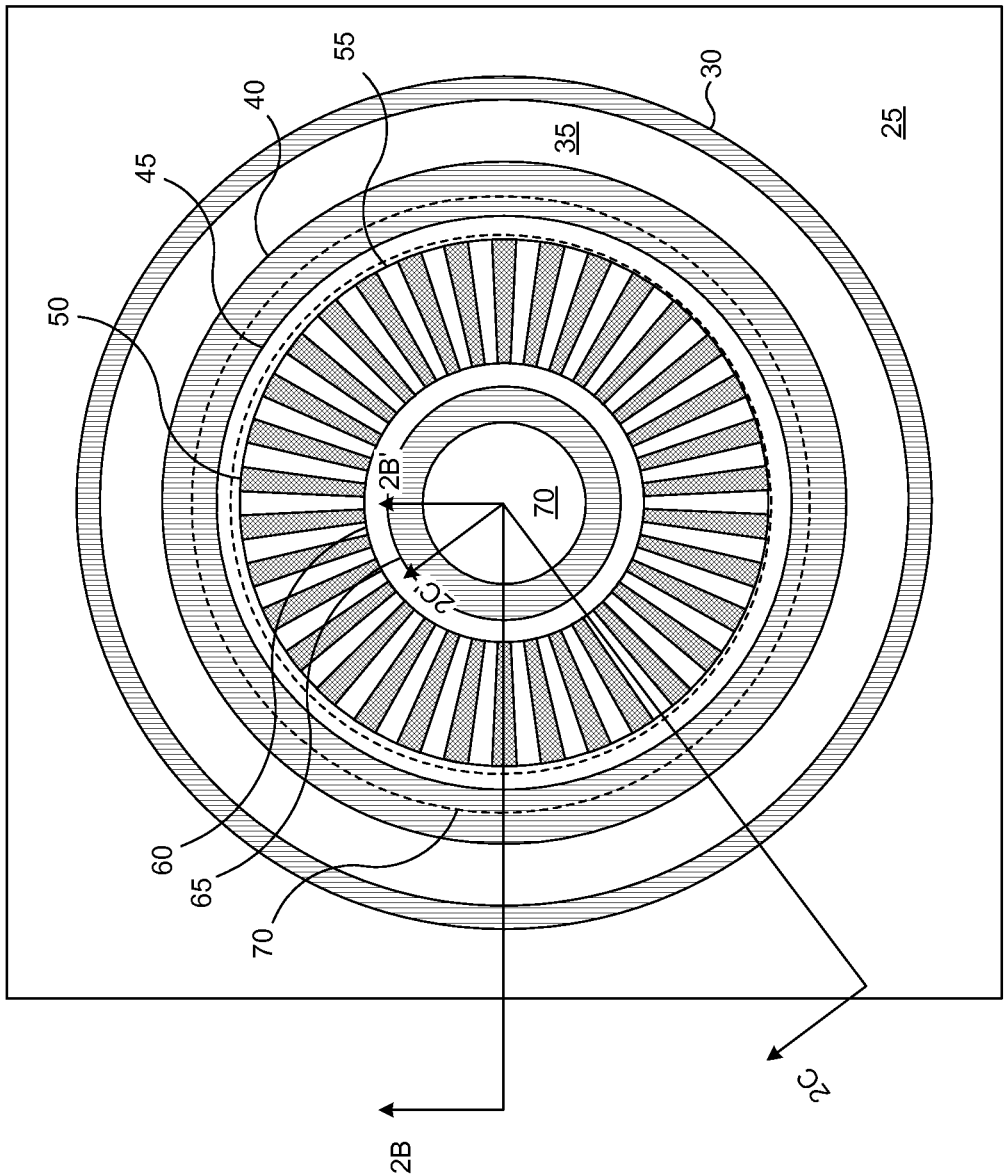
FIG. 2A is a topographical view of an embodiment of a lateral power MOSFET formed according to the present invention.

Referring more particularly to the drawings, FIG. 2A is a topographical view (i.e., a view from a top perspective) of a lateral power MOSFET 20 formed according to the embodiment of the present invention. The transistor 20 exhibits an annular or ring-shaped topography (e.g., a circular topography) about a central or center point shared by a collection of annular structures. As used herein, the term "annular" refers to a circular, oval, closed-line, encircling, or ring-shaped region, zone, construct or structure that laterally surrounds a feature in an integrated circuit chip and that shares a central or center point with the feature. (The annular region may or may not be in contact with the feature that it laterally surrounds.) The structures illustrated in the topographical view of FIG. 2A include a P-well (PW) 25, a P+ bulk region 30, an isolated (e.g. isolation, isolating, insulating) structure 35, a source region 40, a gate 45, a P-top edge to drain side region 60, a drain region 65, and a PAD area 70. Also included is a plurality of P-top/N-grade regions 50 and a plurality of high-voltage N-well (HVNW) regions 55. The P-top/N-grade regions 50 are formed on a first plurality of disjoined slices forming a first section of the transistor 20, the slices comprising (e.g., being defined by) a first set of circular arcs. The HVNW regions 55 are formed on a second plurality of disjoined slices forming a second section of the transistor 20, the slices comprising (e.g., being defined by) a second set of circular arcs. The slices of the first section are interleaved (e.g., alternate) with the slices of the second section. According to one exemplary embodiment, each arc subtends an angle of about 1 to 10 degrees. Taken together, the slices of the first section and the slices of the second section in the illustrated embodiment comprise the entire transistor (i.e., lateral power MOSFET) 20.

Figure 2B:
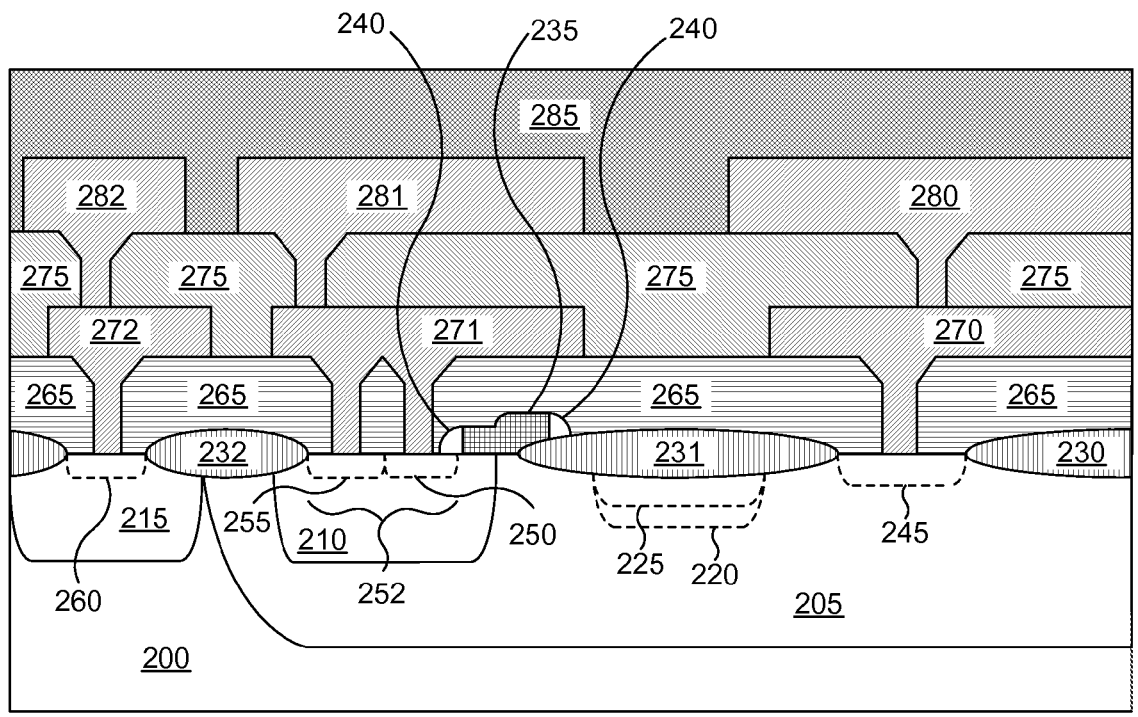
FIG. 2B is a cross-sectional view, taken along a line 2B-2B', of a first section of an embodiment of the lateral power MOSFET of FIG. 2A.
Figure 2C:
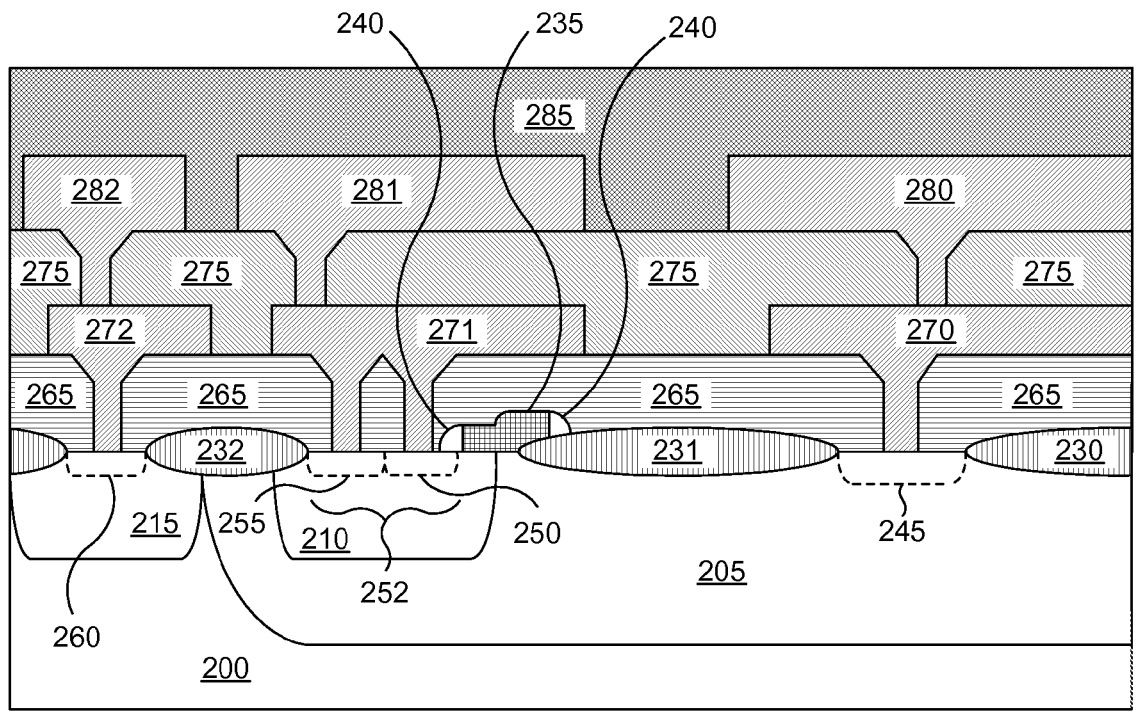
FIG. 2C is a cross-sectional view, taken along a line 2C-2C', of a second section of an embodiment of the lateral power MOSFET of FIG. 2A.

The embodiment of FIG. 2A is illustrated in detail in FIGS. 2B and 2C, which are cross-sectional views, taken along respective lines 2B-2B' and 2C-2C', of the embodiment of FIG. 2A. Line 2B-2B' passes through the first section of the transistor 20, including a P-top/N-grade region 50, and line 2C-2C' passes through the second section of the transistor 20, including the HVNW region 55. As illustrated in FIGS. 2B and 2C, the two sections may appear to be identical except that the first section (FIG. 2B) includes P-top 220 and N-grade 225 regions disposed as described below, those regions not appearing in the second section (FIG. 2C).

Portions of FIGS. 2B and 2C pertain to both the first and second sections of FIG. 2A as defined above. Both sections comprise a substrate 200 formed of material of a first conductivity type. In the examples illustrated herein, the first conductivity type is P-type, but it will be evident to one skilled in the art that references to P-type and N-type materials and implantations in this disclosure may be replaced by respective references to N-type and P-type materials and implantations. The substrate 200 may be formed of P-type material or, according to another embodiment, the substrate 200 may be replaced with a P-type epitaxial layer.

The substrate 200 may have formed therein an HVNW 205 having a circular topography with a radius of about 150 to 500, an example being 200, microns, about a center and having a depth of about 3 to 10, an example being 7, microns.

A first PW 210 may be formed in an outer portion of the HVNW 205. As used herein, terms "inside" and "outside" as well as "inner" and "outer" and the like refer to structures that are, respectively, nearer to an expressed or implied reference center point or farther from the center point. That is, A is "outside" B if A is farther from the center point than B, in which case B is "inside" A. A second PW 215 may be formed in the substrate 200 outside and adjacent to the HVNW 205. According to an example, the first PW 210 has a shape of an annular ring having an inner radius of about 100 to 300, an example being 150, microns, and an outer radius of about 125 to 400, an example being 175, microns. The second PW 215 likewise has a shape of an annular ring having an inner radius of about 150 to 500, an example being 200, microns.

As illustrated in FIG. 2B, the transistor 20 may comprise a P-top region 220 and an N-grade region 225 in the first section of the transistor 20. It should be noted (FIG. 2C) that the second section of the transistor 20 does not include the P-top 220 and N-grade 225 regions. The P-top region 220 is disposed in a surface of the HVNW 205 (in the first section) in a shape of an articulated annular ring having an inner radius of about 50 to 100, an example being 60, microns, an outer radius of about 80 to 150, an example being 110, microns, and a depth of about 0.5 to 3, an example being 1.5, microns. The N-grade region 225 is disposed in the P-top region 220 to a depth of about 0.1 to 1, an example being 0.3, microns.

Field oxide (FOX) structures are formed in the first and second sections to overlie the HVNW region 205, the P-top region 220, portions of the first PW 210 and portions of the second PW 215. A first portion 230 of the FOX, having a radius of about 30 to 80, an example being 40, microns, overlies a center region of the HVNW 205. A second annular portion 231 of the FOX overlies the P-top 220, edges of the second portion 231 extending inside and outside the P-top 220 and inside the first PW 210. A drain region comprising a first annular N+ region 245 is disposed in a surface of the HVNW region 205 between the first portion 230 and the second portion 231 of the FOX. A source region, comprising a second annular N+ region 250 abutting a first P+ region 255, is disposed in an inside portion of a surface of the first PW 210. A third portion 232 of the FOX overlies an outer portion of the first PW 210 not occupied by the first P+ region 255, a portion of the HVNW 205, and a portion of the second PW 215. A fourth portion of the FOX (not designated in FIGS. 2B and 2C) overlies a portion of the second PW 215. An annular P+ bulk region comprising a second P+ region 260 is disposed in a surface of a portion of the second PW 215 between the third portion 232 of the FOX, and the fourth portion of the FOX.

An annular gate 235 is formed in the first and second sections comprising, for example, a conducting material such as poly-crystal (POLY) and/or tungsten silicide (WSix), the gate 235 having an inner radius of about 80 to 300, an example being 130, microns, and an outer radius of about 110 to 390, an example being 165, microns. The gate 235 overlies an outer portion of the second FOX portion 231, a portion of the HVNW 205 and an inner portion of the first PW 210. Spacers formed of, for example, tetraethoxysilane (TEOS) and having a thickness about the same as that of the gate 235 and a width of about 0.1 to 0.4, an example being 0.2, microns, are disposed adjacent to inner and outer boundaries of the gate 235. An interlayer dielectric (ILD) 265 overlies the aforementioned structures, the ILD 265 having contacts formed therein. An annular first metal layer (M1) overlies the ILD 265, a first portion 270 of M1 making contact with the first N+ region 245 (i.e., making contact with the drain through a contact opening in the ILD 265). A second portion 271 of M1 makes contact with the second N+ region 250 and the first P+ region 255 (i.e., making contact with the source through two contact openings in the ILD 265), and a third portion 272 of M1 makes contact with the second P+ region 260 (i.e., making contact with the P+ bulk region through a contact opening in the ILD 265). An intermetal dielectric (IMD) 275 layer overlies M1 270, 271 and 272 and portions of the ILD 265, the IMD 275 having vias formed therein. An annular second metal layer (M2) overlies the IMD 275, a first portion 280 of M2 making contact with the first portion 270 of M1 through a first via (not designated). A second portion 281 of M2 makes contact with the second portion 271 of M1 through a second via (not designated), and a third portion 282 of M2 makes contact with the third portion 272 of M1 through a third via (not designated). A passivation layer 285 overlies M2 280, 281 and 282 and portions of the IMD 275.

Figure 1B:
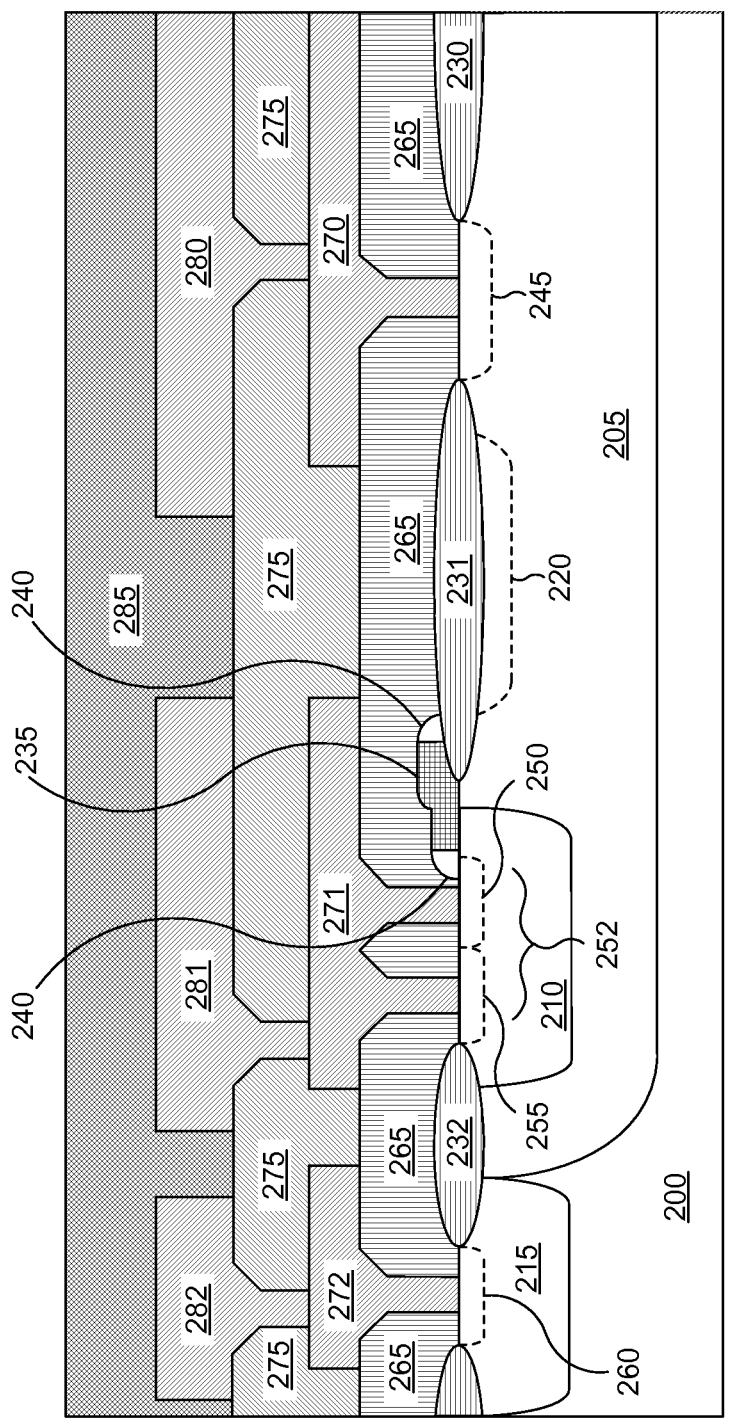
FIG. 1B shows a cross-sectional view, taken along a line 1B-1B', of the prior-art lateral power MOSFET of FIG. 1A.

By way of comparison, a prior-art lateral power MOSFET 21 is shown in FIG. 1A with a circular arrangement about a center point shared by a collection of surrounding structures. A PW 26, a P+ bulk region 31, an isolated (e.g., isolation or insulating) structure 36, a source 41, a gate 46, a P-top edge to drain side 61, a drain 66, and a PAD area 71 may be similar or analogous to corresponding structures in FIG. 2A. The P-top/N-grade 50 and HVNW region 55 of FIG. 2A are replaced by a simpler structure P-top 51 in the prior art device. A cross-sectional view, taken along a line 1B-1B', of the prior art structure of FIG. 1A is shown in FIG. 1B. The prior art transistor 21 includes a P-top region 220 that forms a contiguous annular ring underlying the second FOX portion 231 and does not include an N-grade region. In other aspects, the prior art transistor 21 and the transistor 20 implemented according to the embodiment of the present invention may be viewed to be analogous or similar in one or more aspects.

Figure 3A:
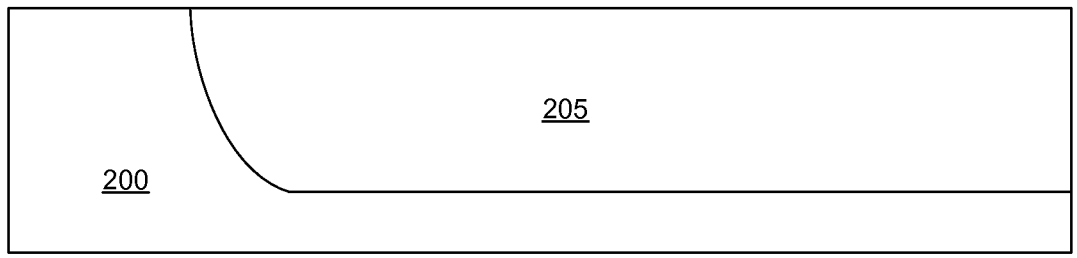
FIG. 3A is a cross-sectional view of a deep N-well formed in a P-type substrate.
Figure 3B:
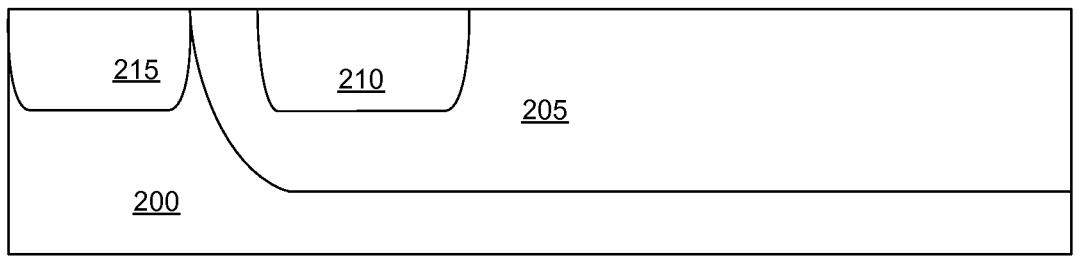
FIG. 3B is a cross-sectional view of first and second P-wells formed in the structure of FIG. 3A.
Figure 4:
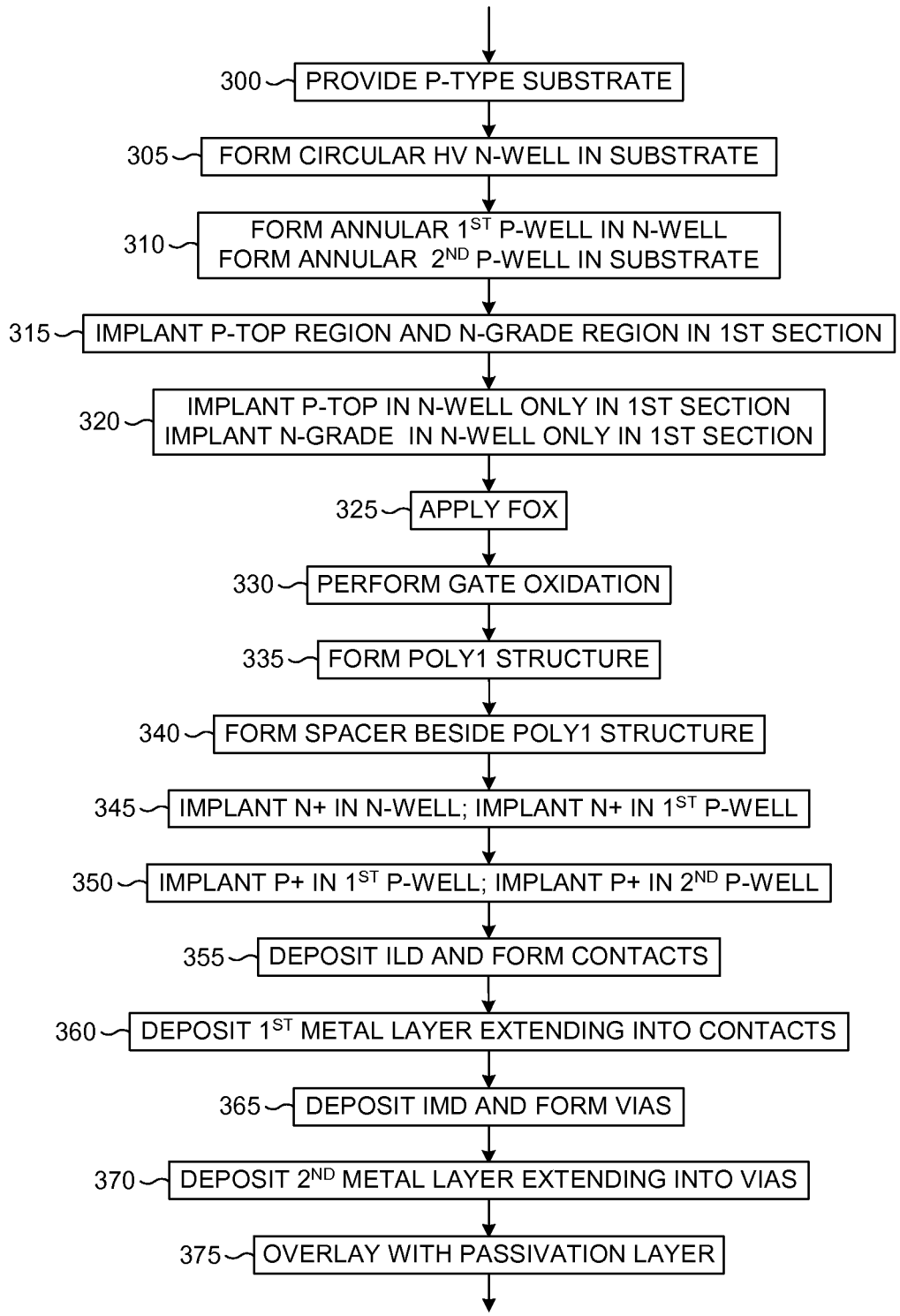
FIG. 4 is a flow diagram summarizing an implementation of a method of fabricating a lateral power MOSFET structure according to the present invention.

FIG. 4 is a flow diagram summarizing an implementation of a method of fabricating a lateral power MOSFET device according to an embodiment of the present invention. The method is described with reference also to FIGS. 3A-3N2. Turning to the sequence of FIGS. 3A and 3B, these cross-sectional views depict steps so early in the processing that they can be considered as taken along either line 2B-2B' or line 2C-2C' of FIG. 2A.

Considering line 2B-2B' as it relates to the fabrication processing, each of FIGS. 3C, 3D1, 3E1, 3F1, 3G1, 3H1, 3J1, 3K1, 3L1, 3M1, and 3N1 is a cross-sectional view taken along this line (i.e., 2B-2B') illustrating an intermediate result of the fabrication as applied to the first section of transistor 20 (i.e., according to later steps of the fabrication). On the other hand, FIGS. 3D2, 3E2, 3F2, 3G2, 3H2, 3J2, 3K2, 3L2, 3M2, and 3N2 are cross-sectional views taken along line 2C-2C' illustrating intermediate results of the fabrication as applied to the second section of transistor 20 (i.e., according to later steps of the fabrication).

The method implementation shown in FIG. 4 commences at step 300 by providing the substrate 200 formed of material of a first conductivity type. In the examples illustrated herein, the first conductivity type is P-type, but it will be evident to one skilled in the art that respective references to P-type and N-type materials and implantations in the disclosure may be replaced by references to N-type and P-type materials and implantations. The substrate 200 may be formed of P-type material or, according to another embodiment, the substrate 200 may be replaced with a P-type epitaxial layer. The HVNW 205 of circular topography may be formed in the substrate 200 at step 305 by patterning a circular portion of a surface of the substrate 200 about a center and implanting the surface with atoms of an N-type dopant (e.g., phosphorus or arsenic) at a concentration of about $10^{11}$ to $10^{13}$, an example being $2\times10^{12}$, atoms/cm$^2$. A high temperature (e.g., from about 1000 to 1200, an example being 1150, degrees C.) may be applied for an extended time (e.g., about 8 to 16, an example being 12, hours) to drive-in the N-type dopant to a depth of about 5 to 9, an example being 7, microns. FIG. 3A illustrates a cross-section of an example of the substrate 200 having a deep N-well, or HVNW 205, formed therein.

At step 310, with reference to FIG. 3B, the first and second P-wells 210 and 215 may be formed in an outer portion of the HVNW 205 and in the substrate 200 outside, and adjacent to, the HVNW 205, respectively. According to an example of a PW process, the first PW 210 may be defined by patterning a surface of the HVNW 205 in the shape of an annular ring, and the second PW 215 may be defined by patterning a surface of the substrate 200 outside the HVNW 205 also in the shape of an annular ring. The HVNW 205 and substrate 200 may then be implanted according to the patterning with atoms of a P-type dopant (e.g., boron) at a concentration of about $10^{12}$ to $10^{14}$, an example being $10^{13}$, atoms/cm$^2$. The resulting structure may be subjected to a temperature ranging from about 1000 to 1200, an example being 1150, degrees C., for a time of about 2 to 8, an example being 4, hours to drive the P-wells 210 and 215 to a depth less than that of the HVNW 205, such as a depth of about 2 to 4, an example being 3, microns.

A plurality of alternating first and second radial sections of the structure of FIG. 3B may be identified at step 315. For example, the first section may be identified as a first plurality of slices of a surface of the HVNW 205, the slices being defined by a first set of circular arcs. The second section may likewise be identified as a second plurality of slices of the surface of the HVNW 205 defined by a second set of circular arcs disjoint from and alternating with the first set of circular arcs. According to one embodiment, each arc subtends an angle of about 1 to 10 degrees. Taken together, the slices of the first section and the slices of the second section can cover the entire surface of the HVNW 205, the first PW 210, and the second PW 215.

Figure 3C:
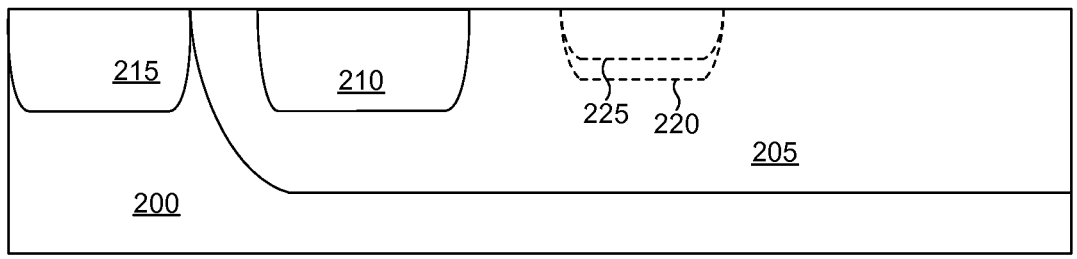
FIG. 3C is a cross-sectional view of P-top and N-grade diffusions formed in a first section of the structure of FIG. 3B, the first section being defined according to FIGS. 2A and 2B.

The P-top region 220 may be formed in the first section of the transistor 20 at step 320 as shown, for example, in FIG. 3C. The P-top 220 region may be formed by patterning the surface of the first section of the HVNW 205 in a shape of an articulated annular ring. Atoms of a P-type dopant (e.g., boron) may then be implanted into the first section at a concentration of about $10^{11}$ to $10^{14}$, an example being $6\times10^{12}$ atoms/cm$^2$, and driven to a predetermined depth by a process such as a step of FOX formation. Also at step 320, atoms of an N-type dopant (e.g., phosphorus or arsenic) may then be implanted in the P-top 220 region at a concentration of about $10^{11}$ to $10^{14}$, an example being $2\times10^{12}$ atoms/cm$^3$, and driven to a depth of about 0.1 to 1, an example being 0.3, microns by a process such as a FOX formation step in order to form the N-grade region 225. It should be noted that the surface of the second section of the HVNW 205 is normally masked during the implantation of the first section. After the implantation of the P-top 220 and N-grade 225 regions, the second section of the transistor 20 is unchanged and appears as shown in FIG. 3B.

The remaining steps in the implementation described in FIG. 4 apply to both the first and second sections of the transistor 20.

Following identification (e.g., determining, referencing, inputting, verifying, selecting, mapping, detecting and/or modifying) of the first and second regions according to step 315, which step may or may not be considered optional and/or non-literal, and the P-top and N-grade implantations at step 320, a field oxide (FOX) isolation layer may be formed on both the first and second sections of the structure of FIGS. 3B and 3C in a form of concentric rings formed around a center portion at step 325. An ensuing FOX process may comprise patterning, growing and etching FOX material according to the form (e.g., layout) of the concentric rings and the center portion. In particular, as illustrated in FIGS. 3D1 and 3D2, the center (i.e., first) portion 230 of FOX may have a circular shape overlying a center portion of the HVNW 205. The second portion 231 of FOX may have an annular shape overlying the P-top 220 and N-grade 225 regions with an inner radius of about 40 to 90, an example being 50, microns, and an outer radius of about 90 to 300, an example being 120, microns. The third portion 232 of FOX may have an annular shape overlying an outer portion of the first PW 210, an outer portion of the HVNW 205, and an inner portion of the second PW 215. The FOX third portion 232 may have an inner radius of about 115 to 390, an example being 165, microns, and an outer radius of about 135 to 410, an example being 185, microns. The fourth portion of FOX (not designated in FIGS. 3D1 and 3D2) may overly an outer portion of the second PW 215.

A gate oxidation process may be performed at step 330 on portions of the surface of the structure resulting from step 325 that are not overlaid with FOX. According to one example, a sacrificial oxidation step may be performed followed by a cleaning and then oxidation of a gate region.

The annular gate 235, such as that shown in FIGS. 3E1 and 3E2 comprising, for example, a layer of polysilicon and a tungsten silicide may be formed at step 335 (e.g., as a poly1 structure) to overlie an outer portion of the second portion 231 of the FOX and an inner portion of the first PW 210. The gate 235 may have a thickness of about 0.1 to 0.7, an example being 0.3, microns. According to an exemplary method, a layer of polysilicon and tungsten silicide may be deposited, the resulting surface being patterned and etched according to the indicated dimensions of the gate 235, and an etch step may be performed, leaving the gate 235 in place.

Turning to FIGS. 3F1 and 3F2, spacers, such as annular TEOS spacers 240, may be formed adjacent to (e.g., on) inner and outer boundaries of the gate 235 at step 340. For instance, a layer of TEOS may be deposited, patterned, and etched to form the spacers 240 on the gate 235 in the first and second sections.

The annular N+ regions 245 and 250 (FIGS. 3G1 and 3G2) may be formed at step 345 by patterning and exposing an annular portion of the surface of the HVNW 205 between the first portion 230 and the second portion 231 of the FOX (i.e., N+ region 245) to form the N-type drain and by patterning and exposing a first annular portion (i.e., N+ region 250) of the source 252 in the first PW 210 adjacent to an outer boundary of the gate 235 and having an outer radius of about 120 to 400, an example being 175, microns. Atoms of an N-type dopant (e.g., phosphorous or arsenic) at a concentration of about $10^{15}$ to $10^{16}$, an example being $2.5\times10^{15}$, atoms/cm$^2$ may be implanted into the exposed portions to form the N+ regions 245 and 250. Similarly, annular P+ regions 255 and 260 (FIGS. 3H1 and 3H2) may be formed at step 350 by patterning and exposing a second annular portion (i.e., P+ region 255) of the source 252 between an outer boundary of N+ region 250 and an inner boundary of the third portion 232 of the FOX and a portion of the second PW 215 between the third portion 232 and the fourth portion (not designated) of the FOX (i.e., P+ region 260), forming the P+ bulk region. The exposed portions may be implanted with atoms of a P-type dopant (e.g., boron) at a concentration of about $10^{15}$ to $10^{16}$, an example being $1.5 \times 10^{15}$, atoms/cm$^2$.

At step 355 the interlayer dielectric (ILD) 265 (FIGS. 3J1 and 3J2) having a thickness of about 0.5 to 2, an example being 0.7, microns, may be overlaid on the structure resulting from step 350, and contacts may be formed in the ILD 265 to reach the N+ regions 245 and 250 and the P+ regions 255 and 260. For example, ILD 265 may be formed by depositing a layer of undoped silicate glass (USG)+borophosphosilicate glass (BPSG), and by patterning, exposing, and etching portions of the ILD 265 to form the contacts.

The first metal layer, M1, comprising separate first, second, and third portions 270, 271, and 272 (FIGS. 3K1 and 3K2) may be formed on the ILD 265 at step 360. The first, second and third portions 270, 271 and 272 of M1 may be formed by depositing a layer of metal (e.g., Al or an Al—Cu alloy), patterning the layer and performing an etch step to expose portions of the ILD 265. According to the illustrated embodiment, the first portion 270 of M1 contacts the drain (i.e., first annular N+ region 245); the second portion 271 contacts the N+ region 250 and P+ region 255 of the source 252; the third portion 272 contacts the P+ bulk region (i.e., the second P+ region 260).

Next, the intermetal dielectric, IMD, layer 275, which may comprise, e.g., plasma-enhanced oxide (PEOX)+spin-on glass (SOG), and which is illustrated in FIGS. 3L1 and 3L2, may be overlaid on first, second and third portions 270, 271 and 272 of M1 and exposed portions of the ILD 265 at step 365. The IMD layer 275, which may have a thickness of about 0.5 to 2, an example being 1, micron, may have vias formed therein that expose portions of the respective first, second and third portions 270, 271 and 272 of M1. The vias can be formed, according to one implementation, by depositing the IMD layer 275, patterning a surface of the IMD layer 275 according to a location of the vias, and performing an etch step to form the vias.

At step 370 the second metal layer, M2, as illustrated in FIGS. 3M1 and 3M2, may be formed in the first, second and third portions (e.g. disjoined portions) 280, 281 and 282, to overlie the IMD 275 and may make contact through the vias with the respective first, second, and third portions 270, 271 and 272 of M1. For instance, M2 280, 281 and 282 may be formed by depositing a layer of Al or an Al—Cu alloy, patterning the layer to define the first, second and third portions 280, 281 and 282, and performing an etch step. The passivation layer, comprising, e.g., PEOX+plasma-enhanced silicon nitride (PESiN), as illustrated in FIGS. 3N1 and 3N2, may be formed using known methods to overlie M2 280, 281 and 282 and portions of the IMD 275.

Figure 5:
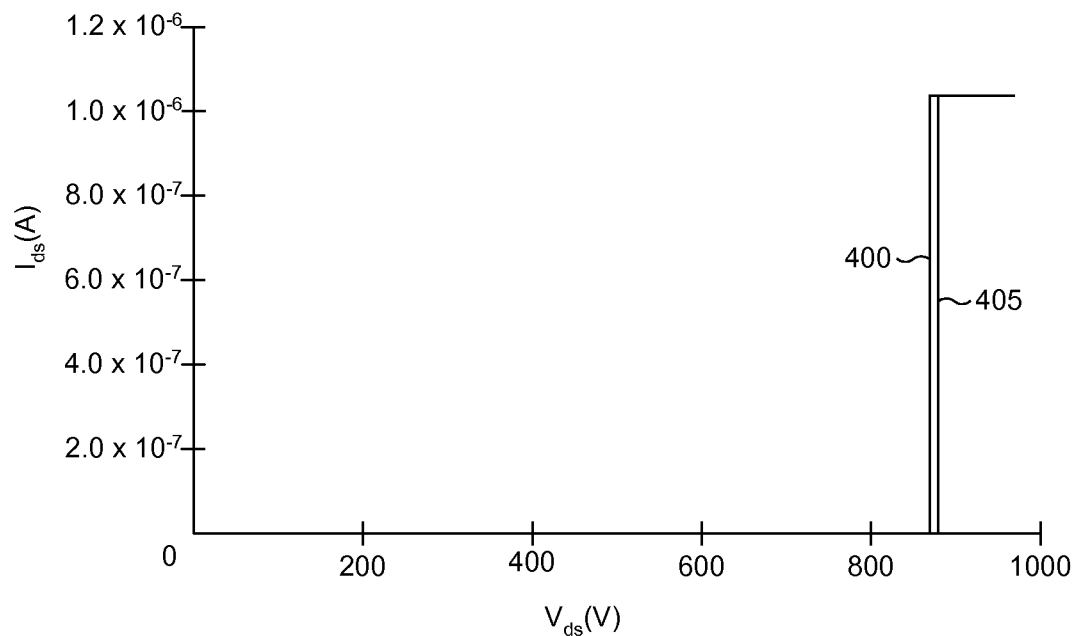
FIG. 5 is a chart comparing breakdown voltages of a prior art lateral power MOSFET and an embodiment of a lateral power MOSFET formed according to the present invention.

A chart illustrating breakdown voltages of lateral power MOSFETs is shown in FIG. 5. The chart includes a first curve 400 showing the breakdown voltage of the prior-art device described above with reference to FIGS. 1A and 1B to be about 870 V. A second curve 405 illustrates breakdown voltage of an example of a new device fabricated according to the present invention, the breakdown voltage of the new device being about 880 V.

Figure 6:
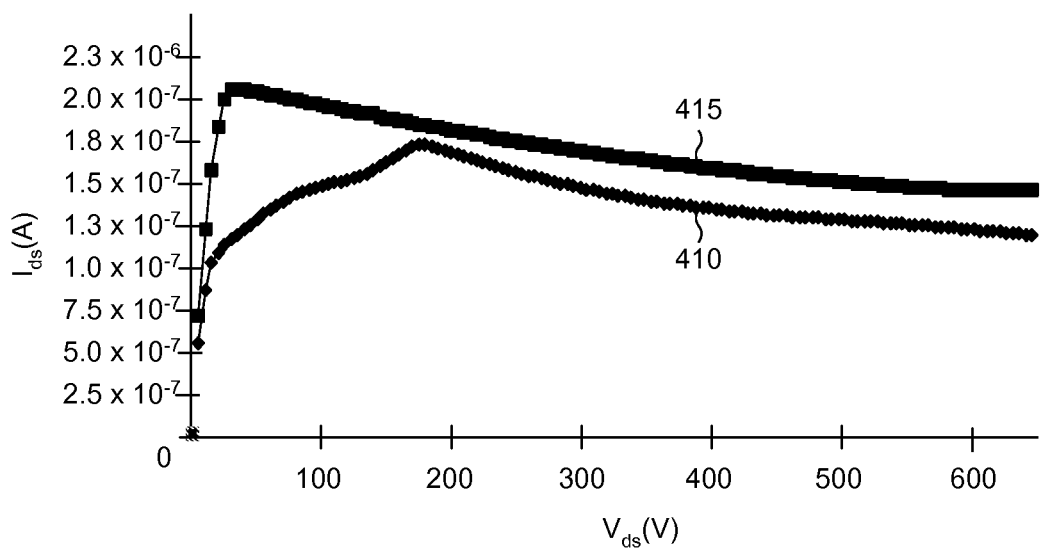
FIG. 6 is a chart comparing drain-source characteristics of an embodiment of a lateral power MOSFET formed according to the present invention with those of a prior art device.

Drain-source characteristics of prior-art and present invention (i.e., new) lateral power MOSFETs are depicted in FIG. 6. A first curve 410, which represents a drain-source characteristic of the prior-art device, is noted to have an irregular shape in a range between about 20 to 180 V. The drain-source characteristic of an example of the new device is illustrated by a second curve 415, which exhibits a relatively regular and smooth shape over a range from about 20 or 30 V to above 600 V. That is, the shape of an initially-rising section of the second curve 415 has a relatively uniform and/or non-varying slope (e.g., slope values that are relatively stable and/or do not exhibit/reflect steeper and flatter or less-steep adjacent sections), followed by a section of diminishing or falling magnitudes with a relatively uniform and/or non-varying slope (e.g., slope values that are relatively stable and/or do not exhibit/reflect steeper and flatter or less-steep adjacent sections). According to one example, shapes of the rising and falling sections can be about linear with respective slopes that are about constant. The specific on-resistance of the new device is about 90.48 Ω-mm$^2$, which may compare favorably with the specific on-resistance of about 115.3 Ω-mm$^2$ of a prior art device.

Figure 7:
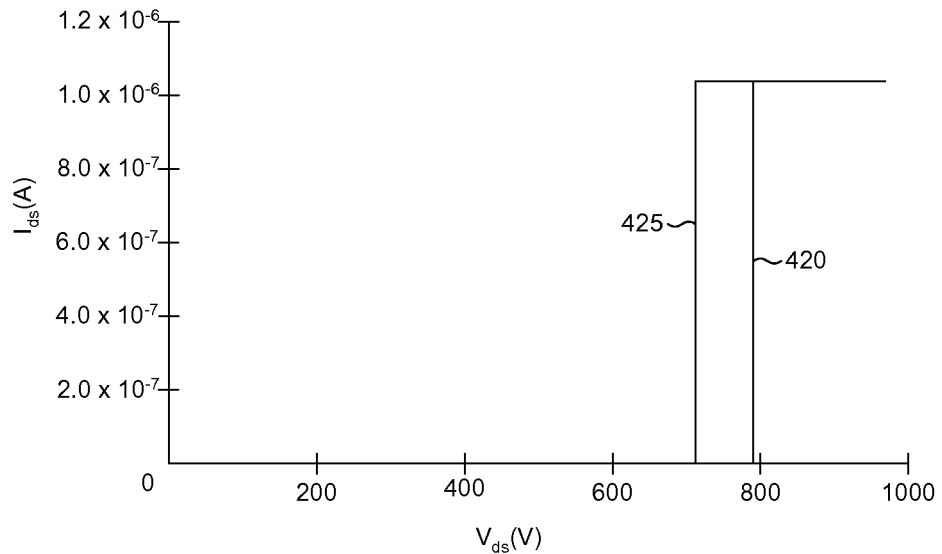
FIG. 7 is a chart illustrating an effect of stress on a prior art lateral power MOSFET.
Figure 8:
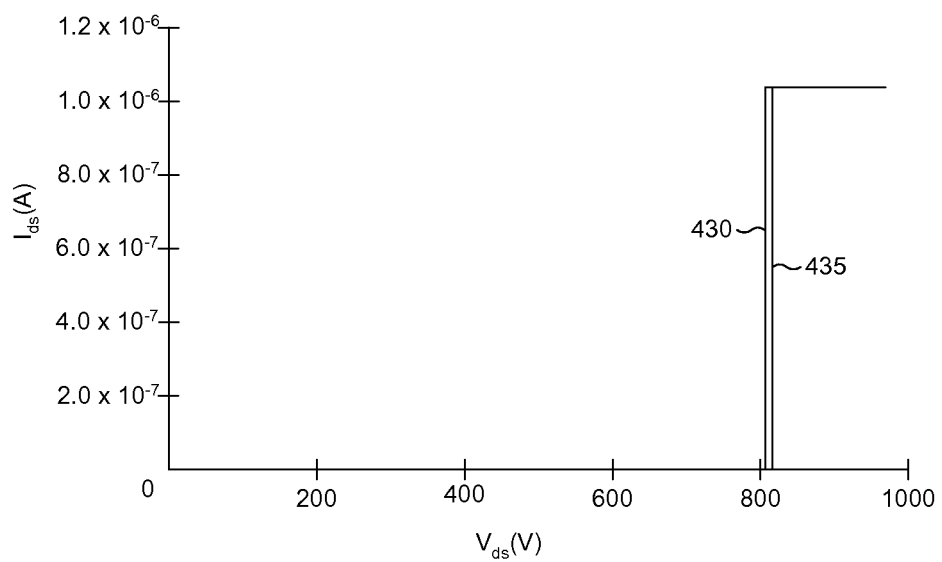
FIG. 8 charts an effect of stress on an embodiment of a lateral power MOSFET formed according to the present invention.

FIG. 7 is a chart illustrating an effect of stress on breakdown voltage of a conventional lateral power MOSFET. One example of stress may take a form of applying 80% of maximum voltage between drain and source of the device for a long time, e.g., 1000 hours. A before-stress curve 420 portrays the breakdown voltage of the prior-art device to be slightly less than 800 V. After stress, as indicated by an after-stress curve 425, the breakdown voltage is reduced to slightly more than 700 V. In contrast, with reference to the chart presented in FIG. 8, an effect of stress on an embodiment of the new device is less. The breakdown voltage, which is slightly more than 800 V prior to application of stress, is shown in the figure with a before-stress curve 430. After stress, as shown by an after-stress curve 435, the breakdown voltage of the new device is approximately unchanged, actually increasing by about 10 volts.

Although the disclosure herein refers to certain illustrated embodiments, it is to be understood that these embodiments have been presented by way of example rather than limitation. The intent accompanying this disclosure is to have such embodiments construed in conjunction with the knowledge of one skilled in the art to cover all modifications, variations, combinations, permutations, omissions, substitutions, alternatives, and equivalents of the embodiments, to the extent not mutually exclusive, as may fall within the spirit and scope of the invention as limited only by the appended claims.

What is claimed is:

1. A semiconductor structure, comprising:
    a substrate of a P-type material;
    a high-voltage well disposed in the substrate of a N-type material;
    an element having a source area and a drain area disposed in the high-voltage well;
    a top region of the P-type material disposed in, and separated from the source and drain areas by, the high-voltage well;
    a grade region of the N-type material disposed on the top region;
    the structure has a circular topography disposed about a center;
    a first section comprises a first plurality of disjoined slices defined by a first set of circular arcs;
    a second section comprises a second plurality of disjoined slices defined by a second set of circular arcs; and one or more slices of the first section alternate with one or more slices of the second section;

first and second P-wells having an annular shape and disposed in a surface of an outer portion of the N-well and in the substrate outside of and adjacent to the N-well, respectively;

the P-top region has a shape of an annular ring and is encircled by the first P-well, and the N-grade region has an annular shape, the structure further comprising:

an N-type drain having an annular shape and disposed in an annular portion of the surface of the N-well and encircled by the P-top region;

a source including annular N-type and P-type respective inner and outer regions disposed in a surface of the first P-well; and a P-type bulk region having an annular shape and disposed in a portion of a surface of the second P-well.

2. The semiconductor structure as set forth in claim 1, further comprising a field oxide layer comprising first, second, third, and fourth portions overlying, respectively, (1) a center portion of the N-well, (2) a region between the drain and the first P-well including the N-grade region, (3) an annular portion of the first P-well, an annular portion of the N-well, and the second P-well, the third portion being disposed to isolate the source and drain, and (4) an annular remainder portion of the second P-well outside the bulk region.

3. The semiconductor structure as set forth in claim 2, further comprising:

a gate formed as an annular deposition of polysilicon and a tungsten silicide overlying an outer portion of the second portion of the field oxide layer and an inner portion of the first P-well; and spacers disposed inside and outside the annular deposition.

4. The semiconductor structure as set forth in claim 3, further comprising an interlayer dielectric overlying the first and second P-wells, the interlayer dielectric including annular contact openings exposing portions of the drain, the inner and outer portions of the source, and the bulk region.

5. The semiconductor structure as set forth in claim 4, further comprising a first metal layer overlying portions of the interlayer dielectric and comprising distinct first, second, and third portions, the first portion contacting the drain, the second portion contacting the inner and outer portions of the source, and the third portion contacting the bulk region.

6. The semiconductor structure as set forth in claim 5, further comprising an intermetal dielectric layer overlying the first metal layer and portions of the interlayer dielectric not overlain by the first metal layer, the intermetal dielectric layer having vias that expose the first, second, and third portions of the first metal layer.

7. The semiconductor structure as set forth in claim 6, further comprising:

a second metal layer overlying portions of the intermetal dielectric layer, the second metal layer having distinct first, second, and third portions contacting, respectively, the first portion of the first metal layer, the second portion of the first metal layer, and the third portion of the first metal layer; and a passivation layer overlying the second metal layer and portions of the intermetal dielectric;

wherein the structure exhibits a specific on-resistance of about 90.5 ohm-millimeters-squared.

* * * * *